(12) United States Patent
Gritti et al.

(10) Patent No.: US 9,822,001 B2
(45) Date of Patent: Nov. 21, 2017

(54) PROCESS FOR MANUFACTURING A LID FOR AN ELECTRONIC DEVICE PACKAGE, AND LID FOR AN ELECTRONIC DEVICE PACKAGE

(71) Applicant: STMicroelectronics S.r.l., Agrate Brianza (IT)

(72) Inventors: Alex Gritti, Vimercate (IT); Paolo Crema, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 748 days.

(21) Appl. No.: 14/067,402

(22) Filed: Oct. 30, 2013

(65) Prior Publication Data

US 2014/0131819 A1    May 15, 2014

(30) Foreign Application Priority Data

Nov. 9, 2012    (IT) .............................. TO2012A0976

(51) Int. Cl.
    *B81C 1/00*    (2006.01)
    *B81B 3/00*    (2006.01)

(52) U.S. Cl.
    CPC ........ *B81C 1/00261* (2013.01); *B81B 3/0018* (2013.01); *B81C 1/00269* (2013.01); *B81B 2201/0257* (2013.01); *B81B 2207/093* (2013.01); *B81C 2203/0109* (2013.01); *B81C 2203/035* (2013.01); *H01L 2224/48137* (2013.01); *H01L 2224/48227* (2013.01); *H01L 2924/15151* (2013.01)

(58) Field of Classification Search
    CPC ......... B81C 1/00; B81C 1/00261; B81B 3/00; B81B 3/0018
    USPC .......................................................... 361/688
    See application file for complete search history.

(56) References Cited

U.S. PATENT DOCUMENTS

| 4,673,467 | A | * | 6/1987 | Nee ........................ C25D 3/38 |
| | | | | 205/149 |
| 5,356,511 | A | | 10/1994 | Hoessel et al. |
| 5,676,812 | A | * | 10/1997 | Kadokura .............. C25D 13/12 |
| | | | | 174/350 |
| 5,866,195 | A | * | 2/1999 | Lemelson ............. C23C 16/545 |
| | | | | 29/599 |
| 6,120,301 | A | * | 9/2000 | Ichitani ................. H01L 21/565 |
| | | | | 257/E21.504 |
| 7,434,305 | B2 | | 10/2008 | Minervini |
| 8,018,049 | B2 | | 9/2011 | Minervini |
| 8,169,442 | B2 | | 5/2012 | Falchetto |
| 8,275,155 | B2 | | 9/2012 | Jeong et al. |
| 8,433,084 | B2 | | 4/2013 | Conti et al. |
| 8,610,006 | B2 | | 12/2013 | Hsu et al. |

(Continued)

FOREIGN PATENT DOCUMENTS

CN    2658728 Y    11/2004
CN    2812465 Y    8/2006
(Continued)

*Primary Examiner* — Eric Thomas
*Assistant Examiner* — Michael P McFadden
(74) *Attorney, Agent, or Firm* — Seed IP Law Group LLP

(57) ABSTRACT

A process for manufacturing a packaged microelectromechanical device includes: forming a lid having a face and a cavity open on the face; coating the face of the lid and walls of the cavity with a metal layer containing copper; and coating the metal layer with a protective layer.

25 Claims, 7 Drawing Sheets

(56) References Cited

U.S. PATENT DOCUMENTS

| | | | |
|---|---|---|---|
| 2004/0135254 A1* | 7/2004 | Fujita | H01L 21/02126 257/751 |
| 2005/0245050 A1* | 11/2005 | Tsao | H01L 24/05 438/460 |
| 2006/0157841 A1 | 7/2006 | Minervini | |
| 2006/0267178 A1* | 11/2006 | Metzger | B81B 7/007 257/698 |
| 2006/0273447 A1 | 12/2006 | Buck, Jr. et al. | |
| 2008/0063232 A1 | 3/2008 | Song | |
| 2008/0079175 A1* | 4/2008 | Bauer | H01L 24/05 257/778 |
| 2008/0099907 A1* | 5/2008 | Oganesian | H01L 23/3114 257/693 |
| 2008/0135939 A1 | 6/2008 | Lin et al. | |
| 2009/0154734 A1 | 6/2009 | Jeong et al. | |
| 2009/0218668 A1 | 9/2009 | Zhe et al. | |
| 2009/0230487 A1 | 9/2009 | Saitoh et al. | |
| 2009/0303602 A1* | 12/2009 | Bright | G02B 1/111 359/585 |
| 2010/0108345 A1 | 5/2010 | Hsu et al. | |
| 2010/0158279 A1 | 6/2010 | Conti et al. | |
| 2011/0081769 A1* | 4/2011 | Takemura | H01L 27/1214 438/463 |
| 2012/0153771 A1* | 6/2012 | Formosa | B81C 1/0023 310/300 |
| 2012/0313115 A1* | 12/2012 | Joo | H01L 33/486 257/88 |
| 2013/0028450 A1 | 1/2013 | Cortese et al. | |
| 2013/0032936 A1* | 2/2013 | Formosa | H04R 31/00 257/704 |

FOREIGN PATENT DOCUMENTS

| | | |
|---|---|---|
| CN | 101006748 A | 7/2007 |
| CN | 101142672 A | 3/2008 |
| CN | 101325823 A | 12/2008 |
| CN | 101478710 A | 7/2009 |
| CN | 102275859 A | 12/2011 |
| CN | 102730619 A | 10/2012 |
| CN | 102762489 A | 10/2012 |
| CN | 203827652 U | 9/2014 |
| EP | 0 962 275 A2 | 12/1999 |
| EP | 1 755 360 A1 | 2/2007 |
| FR | 2 907 633 A1 | 4/2008 |
| TW | 201016592 A | 5/2010 |
| TW | 201127740 A | 8/2011 |
| WO | 2011/061771 A1 | 5/2011 |

* cited by examiner

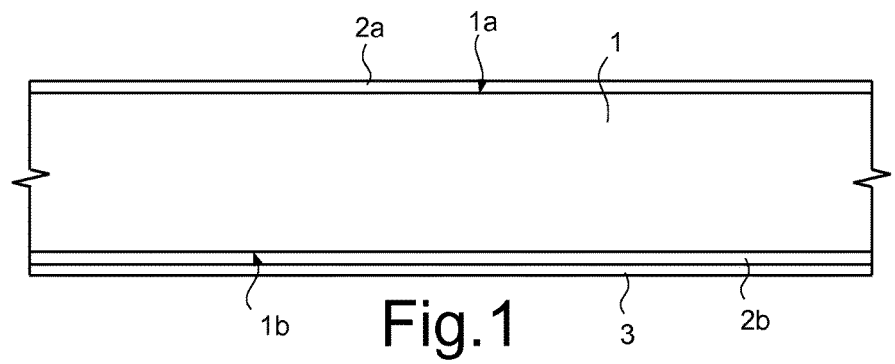
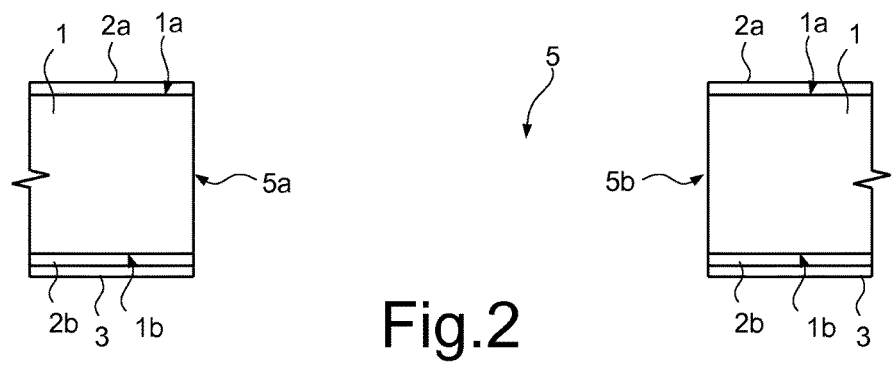
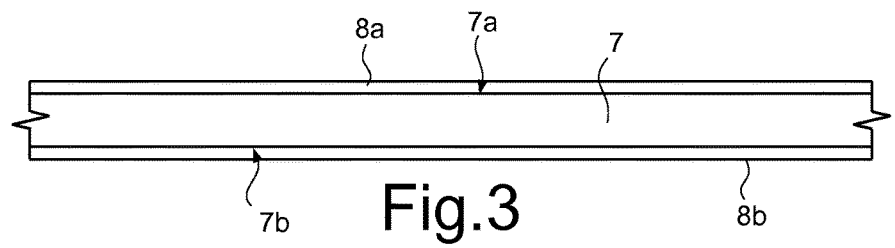
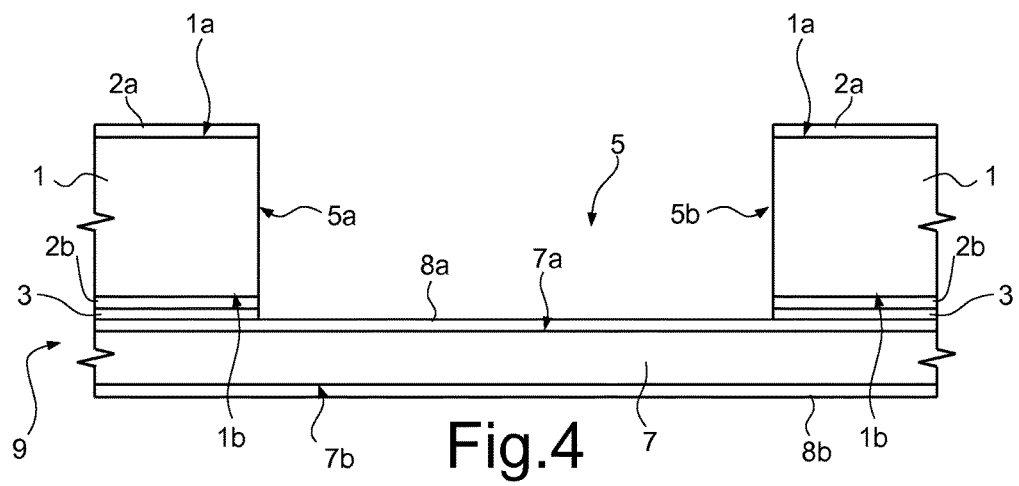

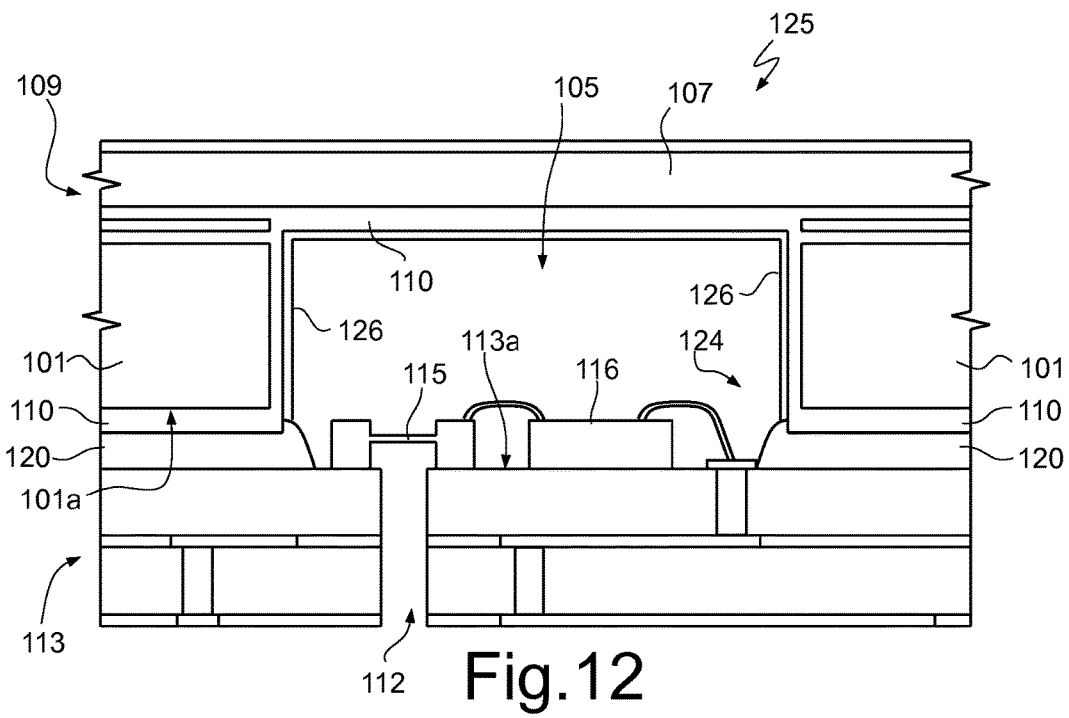
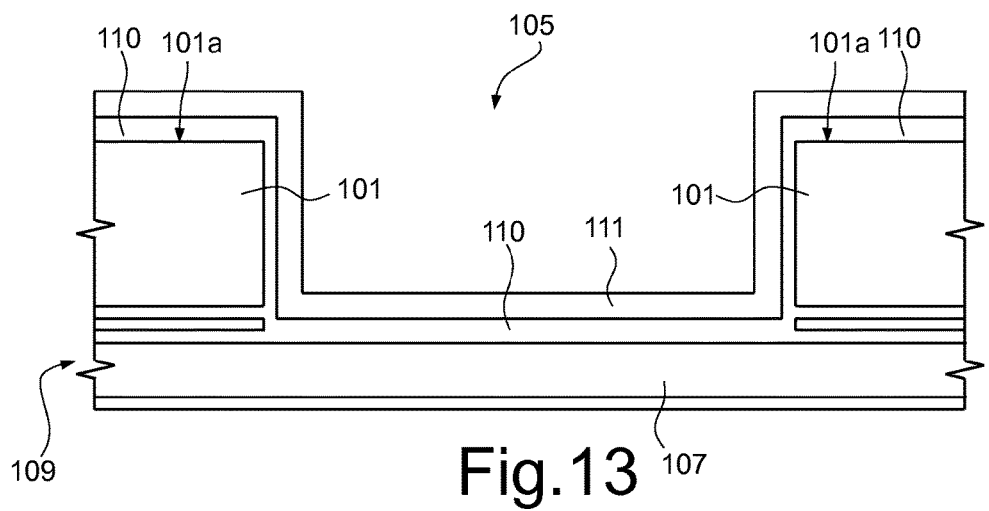

PROCESS FOR MANUFACTURING A LID FOR AN ELECTRONIC DEVICE PACKAGE, AND LID FOR AN ELECTRONIC DEVICE PACKAGE

BACKGROUND

Technical Field

The present invention relates to a process for manufacturing a lid for an electronic device package, to a process for manufacturing a packaged microelectromechanical device, to a lid for an electronic device package, and to a packaged microelectromechanical device.

Description of the Related Art

MEMS (microelectromechanical systems) devices find increasingly extensive use in a wide range of sectors as miniaturized sensors or transducers. For example, microphones and pressure sensors are frequently used in mobile communication devices and filming apparatuses, such as cell phones and video cameras.

Given that the extremely marked miniaturization of MEMS devices entails a certain fragility of micromechanical structures, it is common to use protective lids that encapsulate the parts more readily subject to failure. Normally, MEMS sensors or transducers are mounted on substrates, possibly with control circuits. The substrates are coupled to respective lids and form packages within which the devices to be protected are located.

The protective lids also perform other functions, in addition to that of mere mechanical barrier.

In particular, in many cases, the transmission of the signals may be disturbed by the environment, and hence it is necessary to envisage a protection from light and electromagnetic interference. For this purpose, the cavities of the lids are coated internally by metal shielding layers. The lids may moreover have the function of determining optimal conditions of acoustic pressure for operation of the MEMS sensors.

The protective lids are in general bonded to the substrate on which the MEMS sensors are mounted by conductive glues, which enable grounding of the electromagnetic shielding layer.

Soldering pastes, for example with a base of tin-lead, tin-aluminum-copper, or tin-antimony, would in themselves be preferable to conductive glues, especially on account of the better resistance to impact demonstrated by the results of drop tests. However, soldering pastes melt during the steps of assembly of a package (comprising supporting board, MEMS sensor, and lid) to the boards of the electronic system in which the MEMS sensor is to be used. Molten soldering pastes tend to climb up the vertical conductive walls of the lid, invading the cavities in which the MEMS sensor is housed and leaving empty spaces in the soldering joints. The empty spaces in the soldering joints are particularly undesirable, because, on the one hand, they weaken soldering and, on the other, may cause leakages that affect the performance of the devices, especially when a controlled-pressure reference chamber is desired.

There is thus felt the need to allow the use of soldering pastes in the production of packaged electronic devices comprising microelectromechanical structures.

BRIEF SUMMARY

One or more embodiments of the present invention is to provide a process for manufacturing a lid for an electronic device package, a process for manufacturing a packaged microelectromechanical device, a lid for an electronic device package, and a packaged microelectromechanical device that allow to overcome the limitations described and, in particular, enable use of soldering pastes eliminating or at least reducing the risk of migration of molten soldering paste in cavities for housing the microelectromechanical devices during final assembly.

According to various embodiments of the present invention a process for manufacturing a lid for an electronic device package, a process for manufacturing a packaged microelectromechanical device, a lid for an electronic device package, and a packaged microelectromechanical device are provided.

BRIEF DESCRIPTION OF THE SEVERAL VIEWS OF THE DRAWINGS

For a better understanding of the invention, some embodiments will now be described, purely by way of non-limiting example and with reference to the attached drawings, wherein:

FIG. 1 shows a cross section through a first substrate, in an initial step of a process for manufacturing a packaged microelectromechanical device according to one embodiment of the present invention;

FIG. 2 shows the first substrate of FIG. 1 in a subsequent processing step;

FIG. 3 shows a cross section through a second substrate in a step of the process;

FIG. 4 shows a cross section through a lid according to one embodiment of the present invention, obtained by joining the first substrate of FIG. 2 and the second substrate of FIG. 3;

FIG. 12 is a cross section through a packaged microelectromechanical device, obtained by a process according to a different embodiment of the present invention;

FIG. 13 is a cross section through a lid according to one embodiment of the invention, incorporated in the packaged microelectromechanical device of FIG. 12;

DETAILED DESCRIPTION

Figure 5:
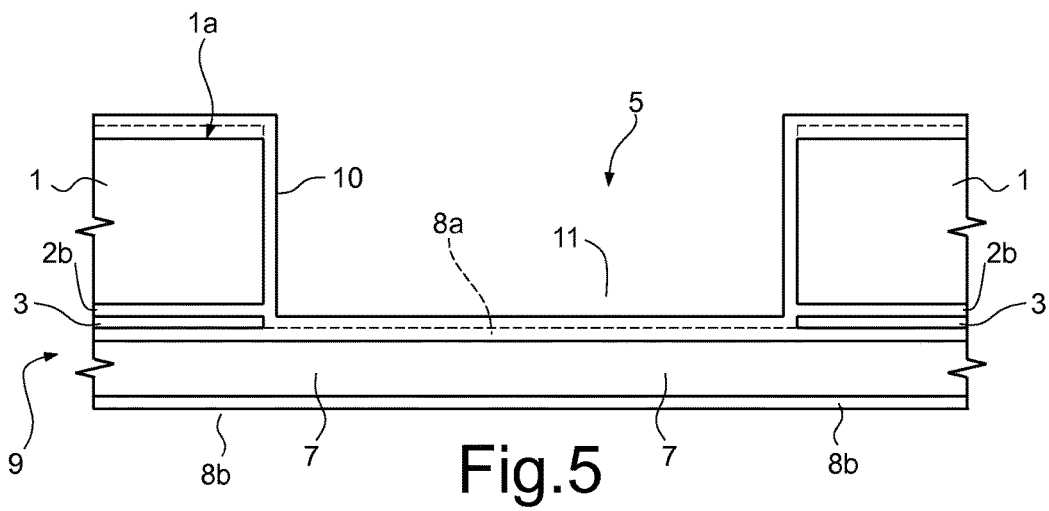
FIGS. 5-7 show the lid of FIG. 4 in successive steps of the process.
Figure 6:
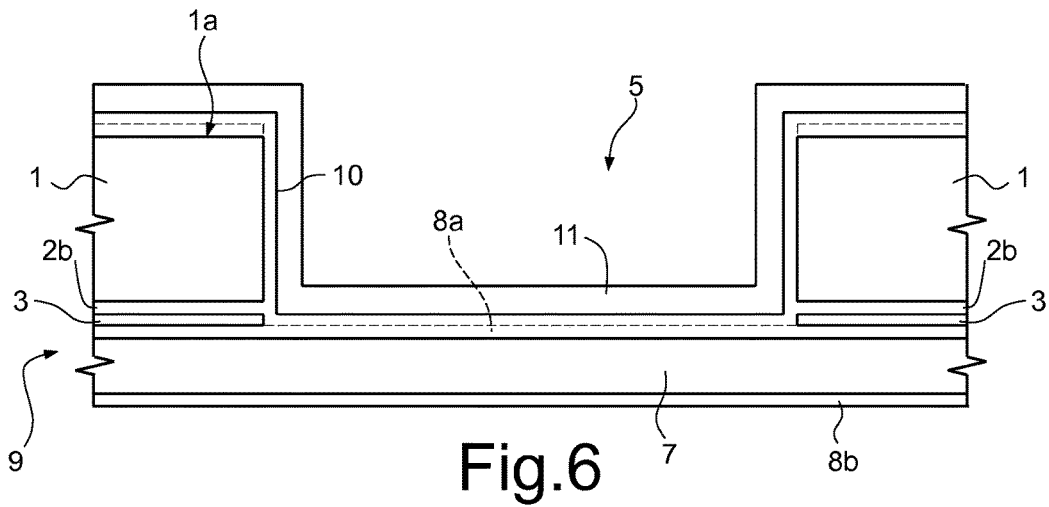

In an initial step of a process for manufacturing a packaged microelectromechanical device, to which FIG. 1 refers, a first face 1a and a second face 1b of a first protective substrate 1 are coated, respectively, with a first conductive layer 2a and a second conductive layer 2b, both made of metal, in particular copper. In one embodiment, the first protective substrate is made of an organic material, for example bismaleimide triazine (BT). Moreover, an adhesive layer 3 is laminated on the second conductive layer 2b.

Next (FIG. 2), a through cavity 5 is formed in the first conductive layer 2a, in the first protective substrate 1, in the second conductive layer 2b, and in the adhesive layer 3, for example by through punching.

As illustrated in FIG. 3, a second protective substrate 7, which has a smaller thickness than the first protective substrate 1 and is made of the same material, is prepared separately. In particular, a first face 7a and a second face 7b of the second protective substrate 7 are coated with a third conductive layer 8a and with a fourth conductive layer 8b, made, for example, of the same material used for the first conductive layer 2a and for the second conductive layer 2b, which in the embodiment described is copper.

The first protective substrate 1 is then bonded to the second protective substrate 7 (more precisely to the third conductive layer 8a) through the adhesive layer 3, as illustrated in FIG. 4. In this way, a lid 9 is obtained, in which the first protective substrate 1 and the second protective substrate 7 form, respectively, side walls 5a and a covering of the cavity 5 on a side opposite to the first face 1a of the first protective substrate 1.

After the first protective substrate 1 and the second protective substrate 7 have been bonded, the lid 9 is coated internally with conductive material by a process of plating, followed by a process of electrodeposition (FIG. 5). In one embodiment, the conductive material is the same as the one used for forming the first layer 2a, the second layer 2b, and the third conductive layer 8a, in particular copper. Residual portions of the first layer 2a and of the second layer 2b and the third conductive layer 8a hence remain incorporated in a shielding layer 10. The shielding layer 10 coats the first face 1a of the first protective substrate 1 and the walls of the cavity 5, i.e., the side walls 5a and a portion of the first face 7a of the second protective substrate 7 facing the cavity 5.

Next, the lid 9 is washed and a protective organometal layer 11 made of organic surface protection (OSP) material is deposited on the shielding layer 10 before the surface of the shielding layer 10 itself is oxidized with copper (II) oxide (CuO). Following upon washing, in fact, a layer of copper (I) oxide ($Cu_2O$) is formed on the surface of the shielding layer 10 and tends in a short time to oxidize further into copper (II) oxide.

The protective organometal layer 11 is formed both within the cavity 5 (on the side walls 5a and on the portion of the first face 7a of the second protective substrate 7 facing the cavity 5) and on the first face 1a of the first protective substrate 1. In one embodiment, in particular, the protective organometal layer 11 is made of a one-pass OSP material. OSP materials, which are commonly used in the production of printed circuits, are obtained by depositing substances such as imidazole and imidazole derivatives, which, in contact with copper, form organometal compounds capable of preventing oxidation of the surface copper. OSP materials are can be removed thermally or else chemically, for example in acid. In the family of OSP materials, one-pass OSP materials form organometal compounds that present greater ease of removal by thermal cycles. In particular, the organometal compounds formed by one-pass OSP materials are substantially removed if subjected to the thermal stress determined by a single cycle of soldering during printed-circuit-board assembly. In one embodiment, the OSP material is obtained by depositing benzotriazole, which forms a compound of Cu(I) benzotriazole.

The protective organometal layer 11 thus prevents oxidation of the shielding layer 10.

Figure 7:
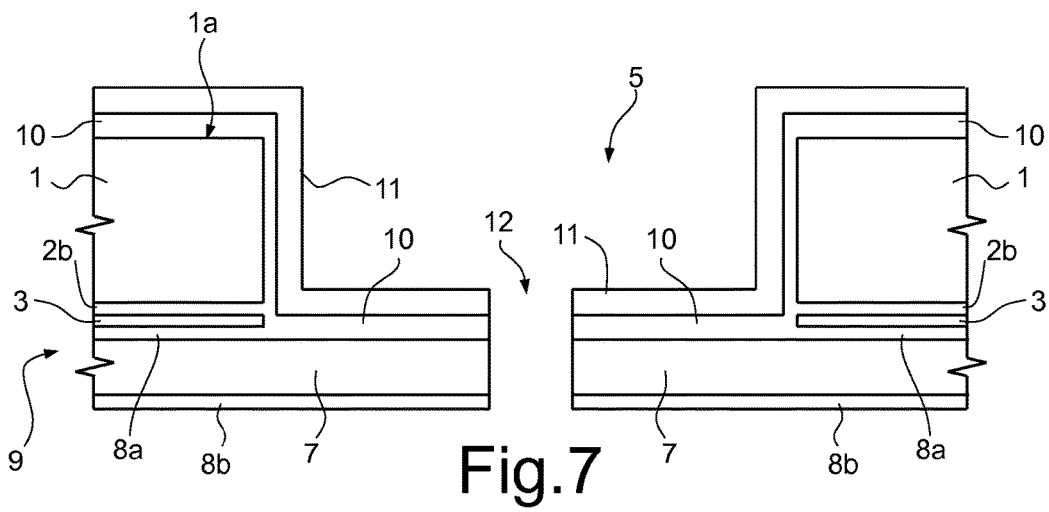

Processing of the second protective substrate 7 is then completed with opening of a through sound port 12 (FIG. 7) so as to set the cavity 5 in communication with the outside world after closing of the lid 9 with another substrate.

Figure 8:
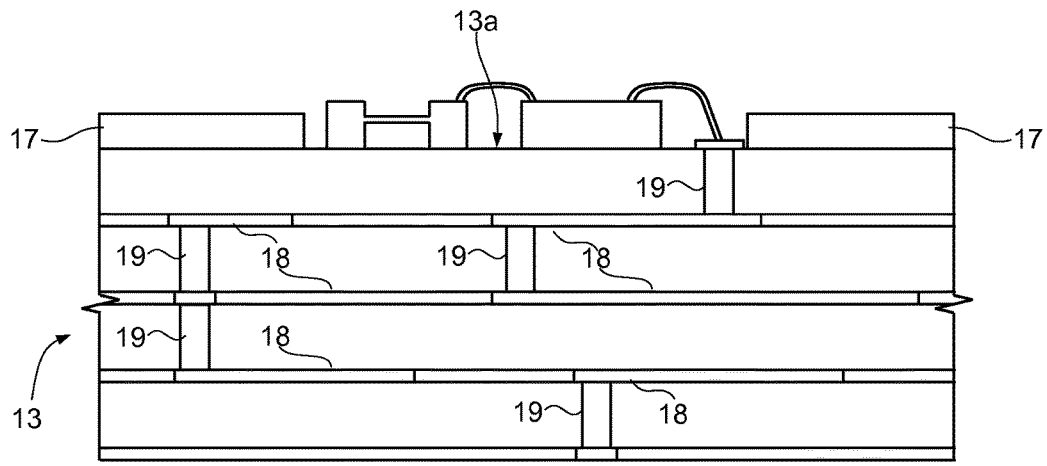
FIG. 8 is a cross section of a third substrate in a step of the process.

It is to be appreciated that various steps of the method may be performed sequentially, in parallel, omitted or in an order different from the order that is described and illustrated. A supporting substrate 13 (FIG. 8), mounted on which are a first chip, integrating a MEMS acoustic transducer 15 (for example, with capacitive variation), and a second chip, integrating an ASIC (application-specific integrated circuit) control circuit 16, is prepared separately by deposition of a layer of soldering paste 17, for example with a base of tin-lead, tin-aluminum-copper, or tin-antimony, on a soldering surface.

The supporting substrate 13 is a composite substrate made of organic material, for example BT, and comprises conductive paths 18 set on a plurality of levels and connected by interconnections 19 (represented purely by way of example). The MEMS acoustic transducer 15 and the control circuit 16 are mounted on a face 13a of the supporting substrate 13 to be fitted to the lid 9. The layer of soldering paste 17 extends over the face 13a of the supporting substrate 13 around the MEMS acoustic transducer 15 and the control circuit 16.

Figure 9:
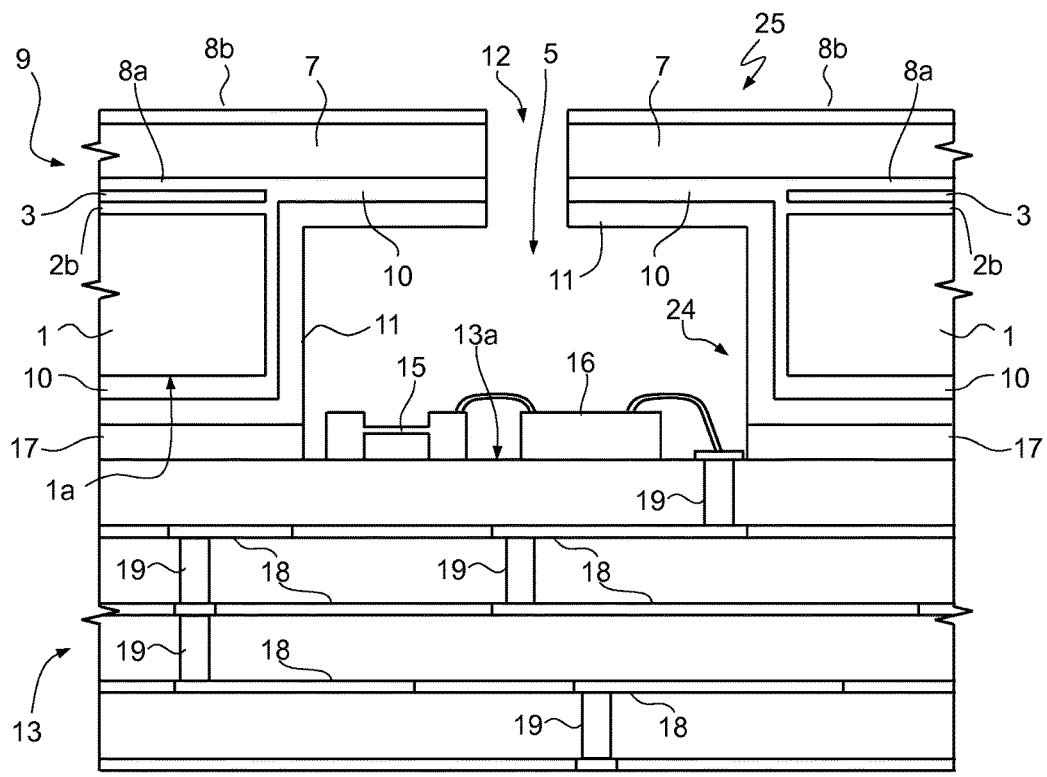
FIG. 9 shows a cross section through a composite structure obtained in an intermediate step of the process, by joining the lid of FIG. 7 and the composite structure of FIG. 8.

The lid 9 is then joined to the supporting substrate 13 as illustrated in FIG. 9, with the protective organometal layer 11 in contact with the layer of soldering paste 17 so that the MEMS acoustic transducer 15 and the control circuit 16 remain housed in the cavity 5.

Figure 10:
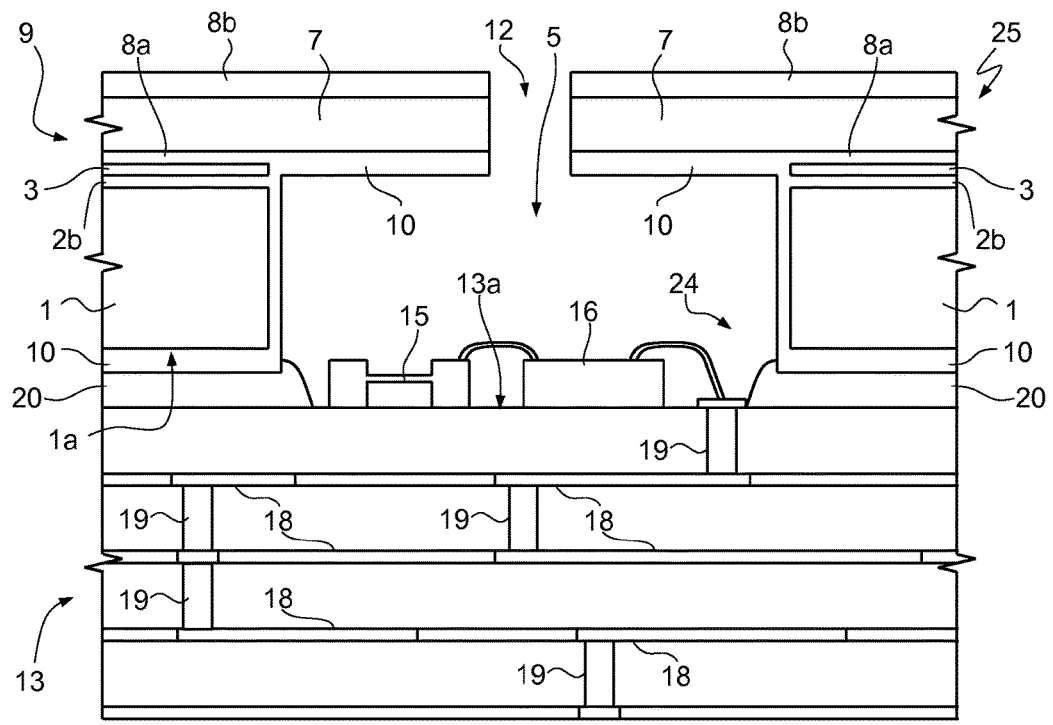
FIG. 10 shows the composite structure of FIG. 9 in a subsequent step of the process.
Figure 11:
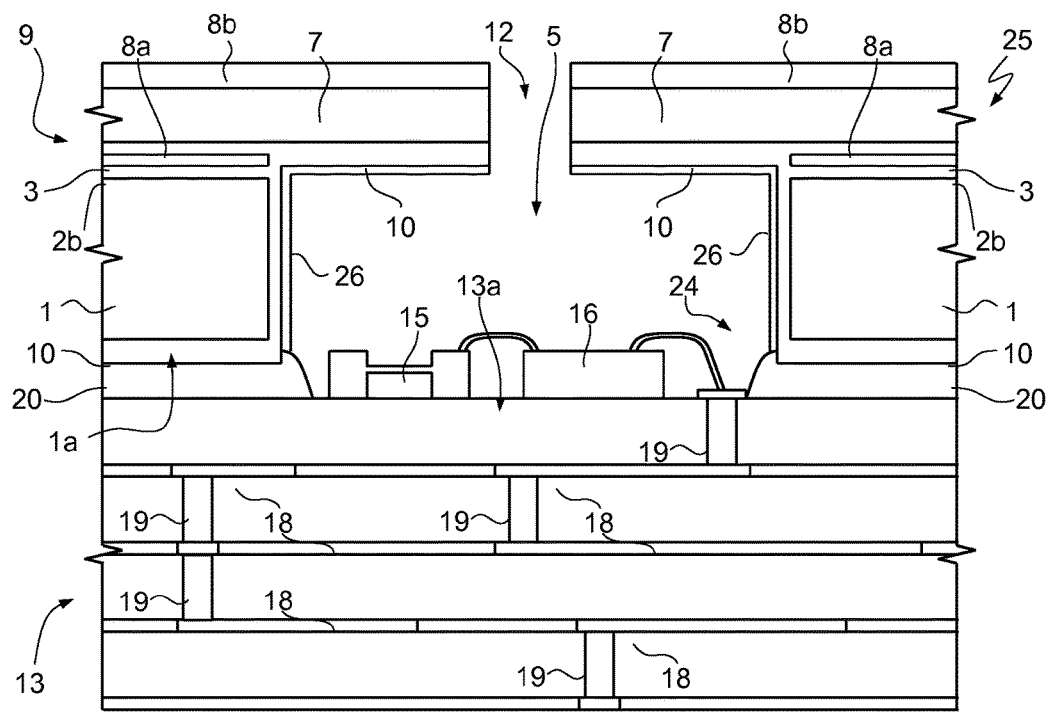
FIG. 11 shows a packaged microelectromechanical device according to one embodiment of the present invention in a final step of the process.

The lid 9 and the supporting substrate 13 are heated until melting of the layer of soldering paste 17 is obtained (FIG. 10). The protective organometal layer 11 is thermally destroyed and releases the shielding layer 10, enabling formation of a conductive soldering joint 20 with the shielding layer 10 itself. In particular, where the protective organometal layer 11 is in contact with the shielding layer 10, the soldering paste penetrates into the protective organometal layer 11, which is destroyed. The OSP material of the protective organometal layer 11 is removed by a flux that is contained in the soldering paste or, alternatively, is deposited prior to soldering. Within the cavity 5 the protective organometal layer 11 vaporizes. The molten soldering paste rises by capillarity into the protective organometal layer 11 also for a short stretch along the shielding layer 10 within the cavity 5. Penetration within the cavity 5 is, however, negligible.

A packaged microelectromechanical device 25, in particular a MEMS microphone, is thus formed, comprising the MEMS acoustic transducer 15, the control circuit 16, and a package 24, forming part of which are the lid 9 and the supporting substrate 13.

Finally, the shielding layer 10, in direct contact everywhere with the atmosphere present in the cavity 5, is coated with a protective layer of copper (II) oxide 26.

Advantageously, the protective layer of copper (II) oxide 26 is permanent and has a very low wettability. For this reason, also during subsequent steps of assembly of the packaged microelectromechanical device 25 to a printed-circuit board, given that the molten soldering paste is unable to climb up the shielding layer 10, which is protected by the protective layer of copper (II) oxide 26, it remains confined in the region of the soldering joint 20 and does not invade the cavity 5.

It is thus possible to use soldering paste instead of conductive glues, without any need to resort to costly solutions, such as Ni-Au plating processes.

According to the embodiment illustrated in FIG. 12, a packaged microelectromechanical device 125, in particular a MEMS microphone, comprises a MEMS acoustic transducer 115, integrated in a first chip, a control circuit 116, integrated in a second chip, and a package 124.

The package 124 comprises a lid 109 and a supporting substrate 113, on which the MEMS acoustic transducer 115 and the control device 116 are mounted. The lid 109, obtained by bonding a first protective substrate 101 and a second protective substrate 107, has a blind cavity 105 and is without through openings. The supporting substrate 113 has a through opening that is formed previously and is in fluid communication with the MEMS acoustic transducer 115 and defines a sound port 112. In this case, the cavity 105 defines a reference chamber for the MEMS acoustic transducer 115. Moreover, a copper shielding layer 110 coats the walls of the cavity 105 and a face 101a of the first protective substrate 101 bonded to the supporting substrate 113.

The packaged microelectromechanical device 125 is obtained as already described, except for the fact that the sound port 112 is obtained in the supporting substrate 113 instead of in the lid 109. In particular, in a step of the process of production, the lid 109, prior to being joined to the supporting substrate 113, is coated with a protective organometal layer 111 made of OSP material, as illustrated in FIG. 13. When the lid 109 and the supporting substrate 113 are bonded by a layer of soldering paste 117, the protective organometal layer 111 made of OSP material is thermally destroyed and exposes the shielding layer 110 both on the face 101a of the first substrate 101 and in the cavity 105. The layer of soldering paste 117 melts and forms a soldering joint 120. The atmosphere present in the cavity 105 causes oxidation of the copper in the exposed portions of the shielding layer 110, which are thus coated with a protective layer of copper (II) oxide 126 (visible in FIG. 12).

Figure 14:
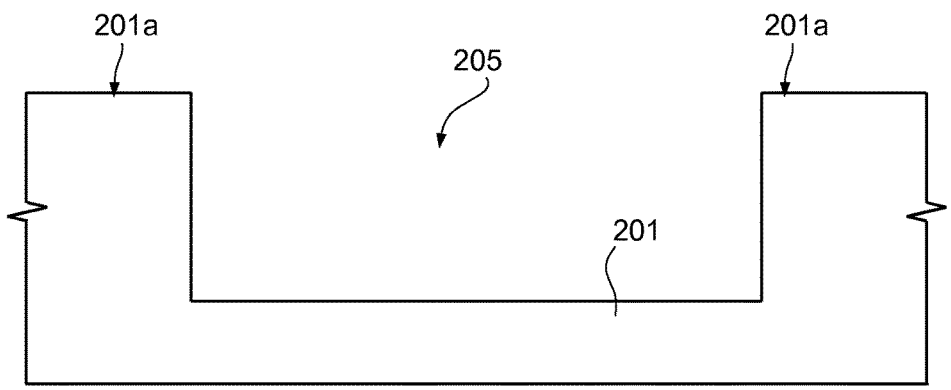
FIG. 14 is a cross section through a substrate, in an initial step of a process for manufacturing a packaged microelectromechanical device according to one embodiment of the present invention.
Figure 15:
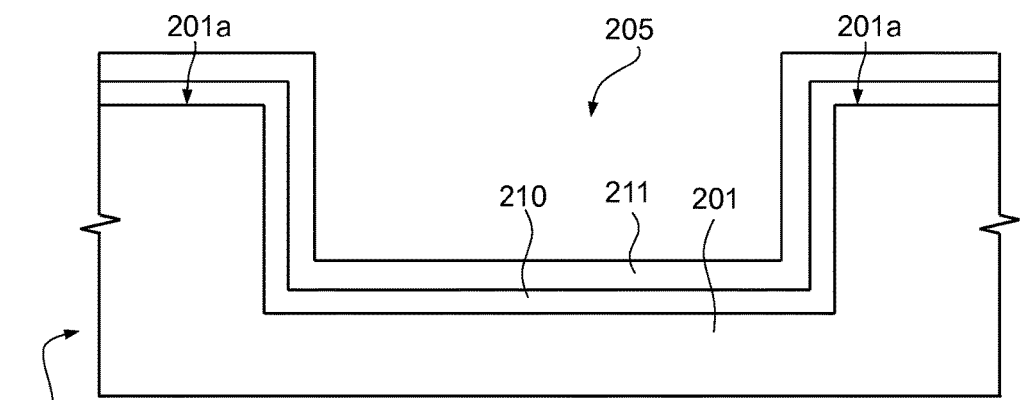
FIG. 15 shows a cross section through a lid according to one embodiment of the present invention, obtained from the substrate of FIG. 14.

According to a different embodiment, illustrated in FIGS. 14 and 15, in a protective metal substrate 201, for example brass, a cavity 205 is obtained by a molding process on a face 201a.

The protective substrate 201 (FIG. 15) is coated with a metal layer 210 of copper, both on the face 201 a and on the walls of the cavity 205, and then with a protective organometal layer 211 made of OSP material. A lid 209 is thus completed.

Figure 16:
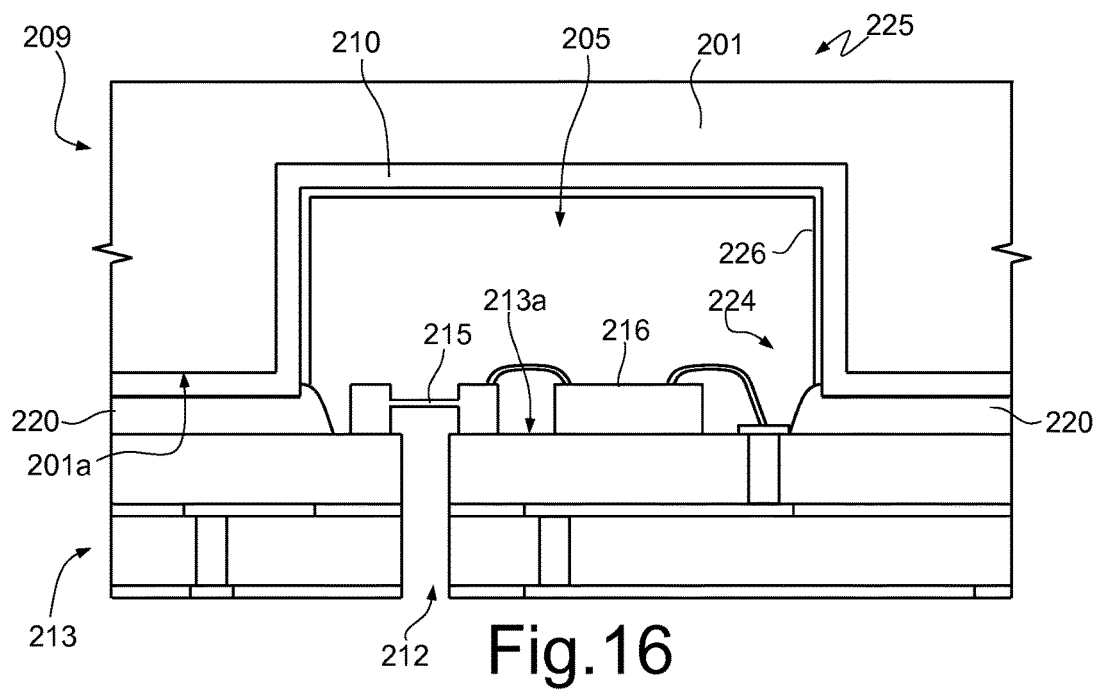
FIG. 16 shows a packaged microelectromechanical device according to one embodiment of the present invention in a final step of the process.

As illustrated in FIG. 16, the lid 209 is then bonded to a supporting substrate 213, mounted on which are a MEMS acoustic transducer 215, integrated in a first chip, and a control circuit 216, integrated in a second chip. The supporting substrate 213 is moreover provided with a sound port 212 for the MEMS acoustic transducer 215.

A packaged microelectromechanical device 225 is thus formed, in particular a MEMS microphone, comprising the MEMS acoustic transducer 215, the control circuit 216, and a package 224, forming part of which are the lid 209 and the supporting substrate 213.

To bond the lid 209 and the supporting substrate 213, a layer of soldering paste is used around the MEMS acoustic transducer 215 and the control circuit 216, which remain housed in the cavity 205. In this step, the protective organometal layer 211 is thermally destroyed and exposes the metal layer 210, enabling formation of a conductive soldering joint 220. In addition, the atmosphere present in the cavity 205 causes oxidation of the copper in the exposed portions of the metal layer 210, which are thus coated by a protective layer of copper (II) oxide 226.

Figure 17:
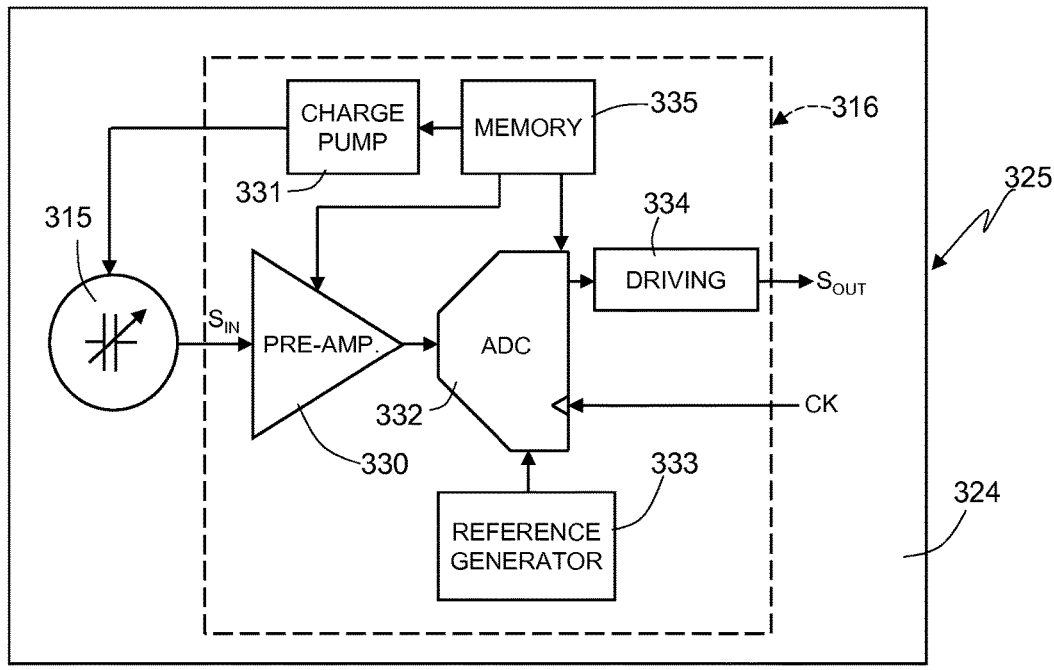
FIG. 17 is a block diagram of a packaged microelectromechanical device.

FIG. 17 shows a simplified block diagram of a packaged microelectromechanical device 325.

The packaged microelectromechanical device 325 comprises a capacitive MEMS acoustic transducer 315 and an integrated control circuit 316, housed in a package 324 according to any one of the embodiments described previously. The integrated control circuit 316 is configured to properly bias the MEMS acoustic transducer 315, to process input signals $S_{IN}$ generated by capacitive variations of the MEMS acoustic transducer 315, and to supply, on an output of the packaged microelectromechanical device 325, a digital output signal $S_{OUT}$, which can be then processed by a microcontroller of an associated electronic device.

In one embodiment, the integrated control circuit 316 comprises: a pre-amplifier circuit 330, of an analog type, which is configured to directly interface with the MEMS acoustic transducer 315 and to amplify and filter the input signal $S_{IN}$ supplied by the MEMS acoustic transducer 315; a charge pump 331, which supplies appropriate voltages for biasing the MEMS acoustic transducer 315; an analog-to-digital converter 332, for example of the sigma-delta type, configured to receive a clock signal CK and a differential signal amplified by the pre-amplifier circuit 330 and to convert the amplified differential signal into a digital signal; a reference generator 333, connected to the analog-to-digital converter 332 and configured to supply a reference signal for the analog-to-digital converter 332; and a driving circuit 334, configured to operate as interface with an external system, for example, a microcontroller of an associated electronic device.

In addition, the packaged microelectromechanical device 325 may comprise a memory 335 of a volatile or non-volatile type, which may be, for example, programmed externally so as to enable a use of the packaged microelectromechanical device 325 in different operating configurations.

Figure 18:
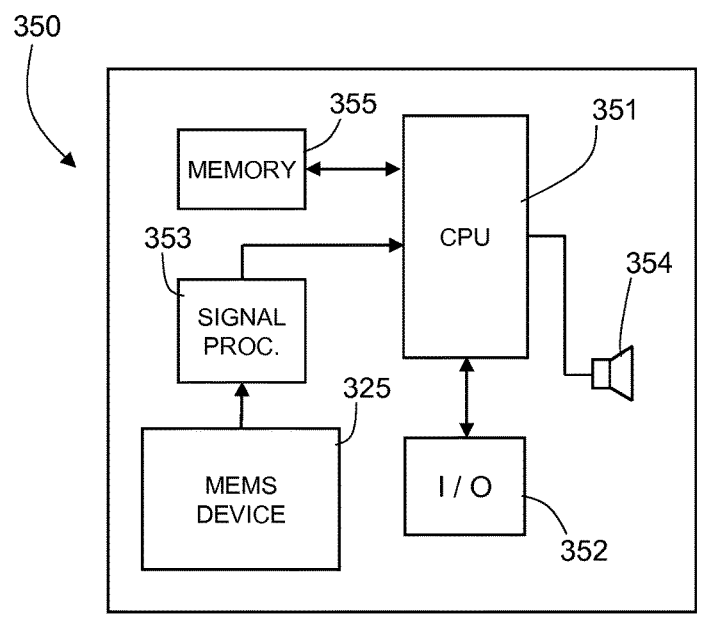
FIG. 18 is a block diagram of an electronic system incorporating the packaged microelectromechanical device of FIG. 16.

The packaged microelectromechanical device 325 may be used in an electronic device 350, as illustrated in FIG. 18. The electronic device 350 is, for example, a portable mobile communication device (for example, a cell phone), a PDA (personal digital assistant), a portable computer (notebook), a voice recorder, a reader of audio files with capacity of voice recording, an acoustic apparatus, etc.

The electronic device 350 comprises, in addition to the packaged microelectromechanical device 325, a microprocessor 351 and an input/output interface 352, connected to the microprocessor 351 and, for example, provided with a keyboard and a display. The packaged microelectromechanical device 325 communicates with the microprocessor 351 through a signal-processing module 353. In addition, the electronic device 350 can comprise a loudspeaker 354 and an internal memory 355.

Modifications and variations may be made to the lid, to the packaged microelectromechanical device, and to the process described, without thereby departing from the scope of the present invention.

In particular, the MEMS acoustic transducer could be replaced by a different MEMS sensor or transducer, in the case where there is the need for said devices to be packaged with a protective lid. The control device might not be present or might be incorporated in one and the same die with the MEMS device.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process comprising:
   forming walls on a surface of a body to form a cavity;
   coating the surface of the body and the walls with a metallic layer containing copper;
   coating the metallic layer with a protective layer;
   positioning the walls on a substrate with solder paste between the walls and the substrate, the metallic layer and the protective layer between the walls and the substrate; and
   heating the protective layer until the protective layer vaporizes and a portion of the metallic layer between the walls and the substrate bonds to the substrate such that the metallic layer is coupled to the solder paste on the second substrate without any intervening layers.

2. The process according to claim 1, wherein the protective layer contains an organic surface protection material.

3. The process according to claim 2, wherein the organic surface protection material is a one-pass organic surface protection material.

4. The process according to claim 2, wherein coating the metallic layer comprises depositing at least one of imidazole and imidazole derivatives on the metallic layer.

5. The process according to claim 2, further comprising:
   washing the body after coating the surface of the body and the walls with a metallic layer, and wherein coating the metallic layer with the protective layer occurs before the metallic layer is coated with copper (II) oxide.

6. The process according to claim 1, wherein the protective layer contains Copper (II) oxide.

7. The process according to claim 1, wherein coating the metallic layer comprises oxidizing the metallic layer.

8. The process according to claim 1, wherein the body comprises a first protection substrate and a second protection substrate bonded to each other, the first protection substrate defining the surface.

9. The process according to claim 8, wherein:
   forming walls on the surface of the body to form the cavity comprises forming the cavity in the first protection substrate; and
   bonding the second protection substrate to the first protection substrate and closing the cavity on a side opposite to the surface.

10. The process according to claim 1, comprising forming the cavity in a metallic protection substrate by through punching.

11. A process for manufacturing a packaged microelectromechanical device, the process comprising:
    forming walls on a surface of a first substrate to form a cavity;
    coating the surface of the substrate and the walls with a metallic layer containing copper;
    coating the metallic layer with a protective layer;
    placing a microelectromechanical device on a second substrate; and
    using solder, bonding the first substrate to the second substrate such that the microelectromechanical device is located in the cavity and the metallic layer and the protective layer is between the walls and the second substrate, the bonding including:
      heating the packaged microelectromechanical device; and
      vaporizing the protective layer such that the metallic layer is in direct contact with the solder.

12. The process according to claim 11, wherein the microelectromechanical device is an acoustic transducer.

13. The process according to claim 11, wherein using solder, bonding the first substrate to the second substrate comprises:
    forming a solder paste layer on the second substrate around the microelectromechanical device;
    placing the first substrate with the protective layer in contact with the solder paste layer; and
    heating the first substrate and the second substrate until the solder paste layer melts.

14. An electronic device package comprising:
    a substrate;
    a soldering paste on the substrate;
    a lid having a body with a surface, walls extending from the surface of the body and forming a cavity;
    a metallic layer including copper on the surface of the body and the walls;
    a protective layer in solid form on the metallic layer, the protective layer being configured to be removed when heated, the protective layer being in direct contact with the metallic layer on a first side and in direct contact with the soldering paste on a second side opposite the first side.

15. The electronic device package according to claim 14, wherein the protective layer contains an organic surface protection material.

16. The electronic device package according to claim 15, wherein the organic surface protection material is a one-pass organic surface protection material.

17. The electronic device package according to claim 14, wherein the protective layer contains Copper (II) oxide.

18. The electronic device package according to claim 14, wherein:
    the body comprises a first protection substrate and a second protection substrate bonded to the first substrate; and
    the first protection substrate and the second protection substrate form respectively lateral walls and a cover of the cavity.

19. The electronic device package according to claim 18, wherein the first protection substrate and the second protection substrate are made of an organic material.

20. The electronic device package according to claim 14, wherein the body comprises a metallic protection substrate.

21. An encapsulated microelectromechanical device comprising:
    the electronic device package according to claim 14;
    a supporting substrate bonded to the lid; and
    a microelectromechanical device arranged on the supporting substrate and located in the cavity.

22. The encapsulated microelectromechanical device according to claim 21, wherein the microelectromechanical device is an acoustic transducer.

23. A device comprising:
- a lid having a body and walls, the walls being on a surface of the body;
- a cavity delimited by the walls and the body having a bottom surface;
- a metallic layer containing copper on the surface of the body and the walls;
- a protective layer on the metallic layer, the protective layer configured to be thermally destroyed;
- a supporting substrate bonded to the lid by solder paste, the metallic layer, the protective layer, and the solder paste being between the walls and the supporting substrate without any additional intervening layers between the walls and the supporting substrate;
- a microelectromechanical device arranged on the supporting substrate and located in the cavity; and
- a control unit coupled to the encapsulated microelectromechanical device.

24. The electronic system according to claim 23, wherein the metallic layer includes Copper (II) oxide.

25. The process according to claim 1, wherein a portion of the metallic layer not between the walls and the substrate undergoes surface oxidization.

* * * * *